(12) United States Patent
Bhushan et al.

(10) Patent No.: US 9,194,909 B2
(45) Date of Patent: Nov. 24, 2015

(54) SINGLE LEVEL OF METAL TEST STRUCTURE FOR DIFFERENTIAL TIMING AND VARIABILITY MEASUREMENTS OF INTEGRATED CIRCUITS

(75) Inventors: Manjul Bhushan, Hopewell Junction, NY (US); Mark B. Ketchen, Hadley, MA (US); Chin Kim, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 937 days.

(21) Appl. No.: 13/410,865

(22) Filed: Mar. 2, 2012

(65) Prior Publication Data

US 2012/0166898 A1 Jun. 28, 2012

Related U.S. Application Data

(62) Division of application No. 12/544,750, filed on Aug. 20, 2009, now Pat. No. 8,179,120.

(51) Int. Cl.
*G01R 31/00* (2006.01)
*G01R 31/317* (2006.01)
*G01R 31/30* (2006.01)

(52) U.S. Cl.
CPC ...... *G01R 31/31725* (2013.01); *G01R 31/3016* (2013.01)

(58) Field of Classification Search
CPC ...................... G01R 31/3016; G01R 31/31725
USPC .............................. 324/617, 618, 76.22, 76.54
See application file for complete search history.

(56) References Cited

U.S. PATENT DOCUMENTS

| | | | |
|---|---|---|---|
| 5,083,299 A | 1/1992 | Schwanke et al. |
| 5,952,891 A | 9/1999 | Boudry |
| 5,995,011 A | 11/1999 | Kurihara et al. |
| 6,239,591 B1 | 5/2001 | Bryant et al. |
| 6,774,395 B1 | 8/2004 | Lin et al. |
| 6,777,708 B1 | 8/2004 | Lin et al. |
| 6,960,926 B2 | 11/2005 | Anderson et al. |
| 2008/0068099 A1 | 3/2008 | Bhushan et al. |
| 2008/0270064 A1 | 10/2008 | Bhushan et al. |

OTHER PUBLICATIONS

M. Bhushan et al.; "Ring Oscillators for CMOS Process Tuning and Variability Control;" IEEE Transactions on Semiconductor Manufacturing, vol. 19, No. 1, Feb. 2006; pp. 10-18.
M. Bhushan et al.; "Aspects fo Variability in Semiconductor Devices, Circuits, and Systems;" Proceedings Conference on Computers and Devices for Communication; 2006.
(Continued)

*Primary Examiner* — Vincent Q Nguyen
(74) *Attorney, Agent, or Firm* — Cantor Colburn LLP; Vazken Alexanian

(57) ABSTRACT

A test structure for an integrated circuit device includes one or more experiments selectively configured to receive one or more high-speed input signals as inputs thereto and to output at least one high-speed output signal therefrom, the one or more experiments each including two or more logic gates configured to determine differential delay characteristics of individual circuit devices, at a precision level on the order of picoseconds to less than 1 picosecond; and wherein the one or more sets of experiments are disposed, and are fully testable, at a first level of metal wiring (M1) in the integrated circuit device.

11 Claims, 8 Drawing Sheets

(56) References Cited

OTHER PUBLICATIONS

M. Bhushan et al.; "Ring Oscillator Technique for MOSFET CV Characterization;" IEEE Transactions on Semiconductor Manufacturing; May 2008.

J. Gautier et al.; "Body Charge Related Transient Effects in Floating Body SOI NMOSFET's;" IEDM Technical Digest; 1995; pp. 623-626.

M. B. Ketchen et al.; "Circuit and technique for characterizing switching delay history effects in silicon-on-insulator logic gates;" Review of Scientific Instruments, vol. 75, No. 3, Mar. 2004; pp. 1-4.

M. B. Ketchen et al.; "High Speed Test Structures for In-Line Process Monitoring and Model Calibration;" Proc. IEEE 2005 Int. Conference on Microelectronic Test Structures, vol. 18, Apr. 2005; pp. 33-38.

M. B. Ketchen et al.; "Product-representative "at speed" test structures for CMOS characterization;" IBM Journal of Research and Development, vol. 50, No. 4/5, Jul. / Sep. 2006; pp. 451-468.

M. B. Ketchen et al.; "Measurement of Thermal Time Constant in 65-nm PD-SOI Technology with Sub-ns Resolution;" 2007 IEEE International SOI Conference Proceedings; Oct. 1-4, 2007.

M. B. Ketchen et al.; "Switching Delay Variability in NMOS and PMOS PDSOI Passgate Circuits;" VLSI TSA Conference Hsinchin, Taiwan 2005.

M. B. Ketchen et al.; "Ring Oscillator Based Test Structure for NBTI Analysis;" Proceedings of ICMTS Conference 2007.

M. Bhushan et al.; "CMOS Latch Metastability Characterization at the 65-nm Technology Node;" International Conference on Microelectronic Test Structures (ICTMS) 2008; Mar. 24-27, 2008.

E. MacDonald et al.; "Delay Testing of SOI Cirucits: Challenges with the History Effect;" IEEE ITC International Test Conference; 1999; pp. 269-275.

D. J. Pearson et al.; "Technique for Rapid, In-Line Characterization of Switching History in Partially Depleted SOI Technologies;" 2004 IEEE International SOI Conference Proceedings; 2004; pp. 148-150.

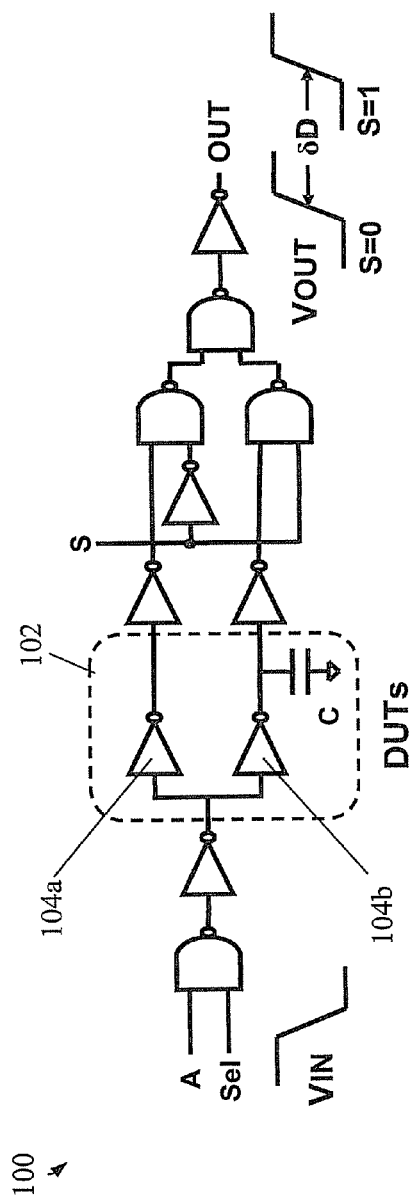
Fig. 1 – Prior Art
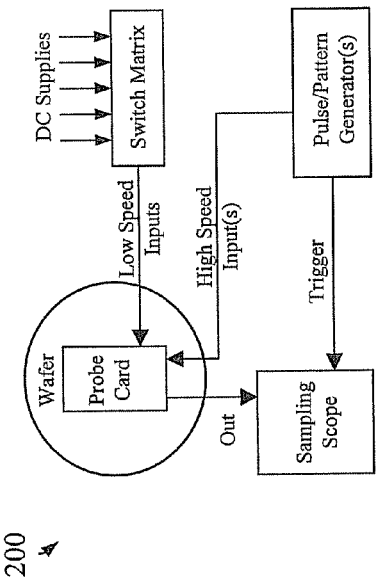
Fig. 2 – Prior Art

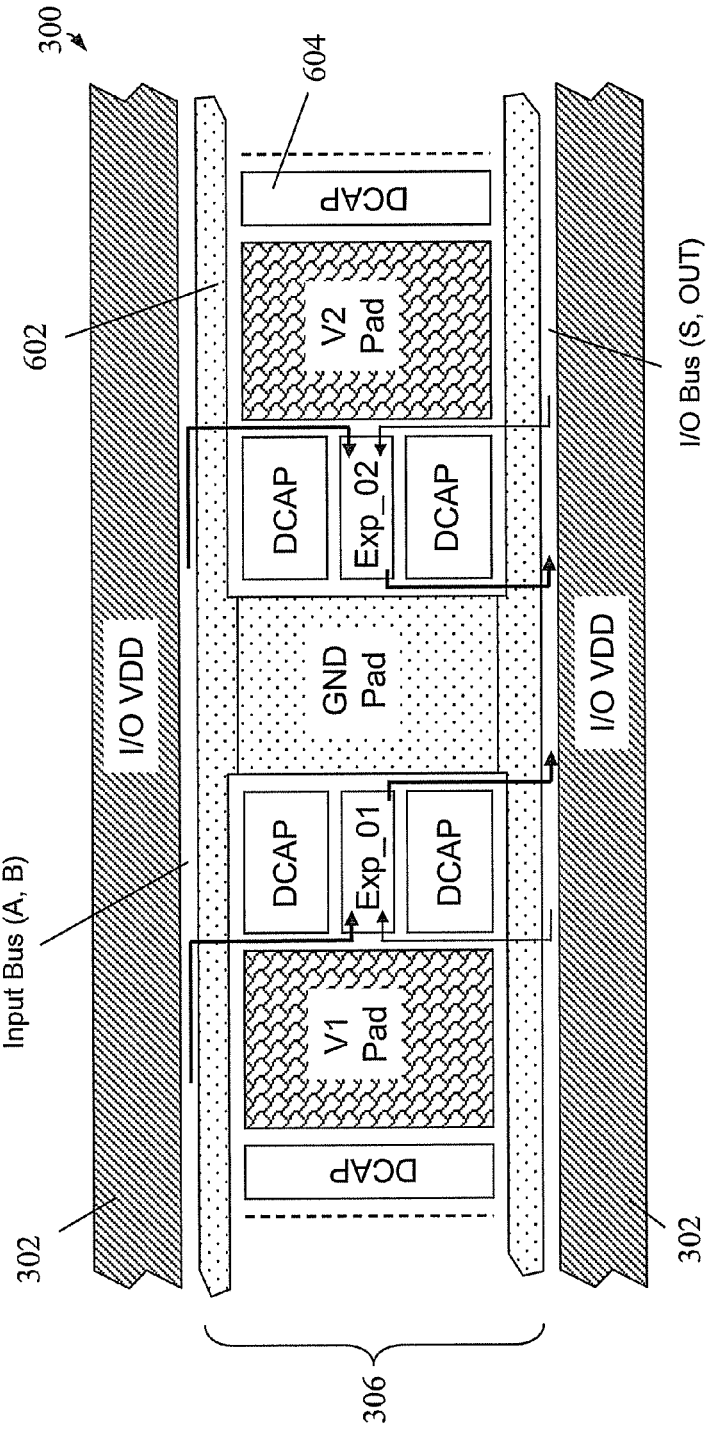

SINGLE LEVEL OF METAL TEST STRUCTURE FOR DIFFERENTIAL TIMING AND VARIABILITY MEASUREMENTS OF INTEGRATED CIRCUITS

CROSS-REFERENCE TO RELATED APPLICATION

This application is a divisional of U.S. patent application Ser. No. 12/544,750, filed Aug. 20, 2009, now U.S. Pat. No. 8,179,120 the disclosure of which is incorporated by reference herein in its entirety.

BACKGROUND

The present invention relates generally to integrated circuit devices and, more particularly, to a single level of metal test structure for differential timing and variability measurements of integrated circuits.

Delays of individual logic gates in complementary metal oxide semiconductor (CMOS) technologies at the 45 nanometer (nm) technology node are on the order of about 10 picoseconds (ps) or less. Measuring delay characteristics of individual gates for monitoring technology performance and variability during process development and manufacturing is a challenging exercise. Typically, the average delay per stage is estimated from the frequency of oscillation of ring oscillators (RO) comprising an odd number of identical inverting stages. The RO frequency is divided so that the output is below 1 MHz for ease of measurement in the manufacturing line.

From this approach it is possible to determine the average of the pullup and pulldown delays of the gate running under steady-state (SS) conditions. It is often of importance to know the pullup and pulldown delays independently, both in SS as well as for different historical switching patterns. This is especially the case with partially depleted silicon on insulator (PDSOI) technology where the delay of a logic gate can vary by as much as 10% or more depending on the previous switching history of the gate, as mediated by the PDSOI floating body. In addition, with the ever continuing scaling of CMOS technologies, it is becoming increasingly important to be able to characterize the variability in gate delays and the AC matching characteristics of nominally identical devices.

SUMMARY

In an exemplary embodiment, a test structure for an integrated circuit device includes one or more experiments selectively configured to receive one or more high-speed input signals as inputs thereto and to output at least one high-speed output signal therefrom, the one or more experiments each comprising two or more logic gates configured to determine differential delay characteristics of individual circuit devices, at a precision level on the order of picoseconds to less than 1 picosecond; and wherein the one or more sets of experiments are disposed, and are fully testable, at a first level of metal wiring (M1) in the integrated circuit device.

In another embodiment, a test structure for an integrated circuit device, includes a generally rectangular outer perimeter comprising an input/output (I/O) VDD bus having a pair of I/O VDD pads at opposing ends thereof; a generally rectangular inner perimeter surrounded by the outer perimeter, the inner perimeter further including a plurality of experiments selectively configured to receive one or more high-speed input signals as inputs thereto and to output at least one high-speed output signal therefrom, each of the experiments comprising one or more logic gates configured to determine differential delay characteristics of individual circuit devices, at a precision level on the order of picoseconds to less than 1 picosecond; a plurality of additional I/O pads in a generally linear arrangement with respect to the I/O VDD pads; one or more common ground buses; and one or more decoupling capacitors; wherein the outer and inner perimeter, including the plurality of experiments are disposed, and are fully testable, at a first level of metal wiring (M1) in the integrated circuit device.

In still another embodiment, a method of testing an integrated circuit device includes selectively inputting one or more high-speed input signals to one or more experiments and outputting at least one high-speed output signal therefrom, each experiment each comprising two or more logic gates configured to determine differential delay characteristics of individual circuit devices, at a precision level on the order of picoseconds less than 1 picosecond; and wherein the one or more experiments are disposed, and are fully testable, at a first level of metal wiring (M1) in the integrated circuit device.

BRIEF DESCRIPTION OF THE SEVERAL VIEWS OF THE DRAWINGS

Referring to the exemplary drawings wherein like elements are numbered alike in the several Figures:

FIG. 1 is a schematic diagram of an existing circuit for determining the differential delay characteristics of PDSOI CMOS circuits;

FIG. 2 is a schematic diagram of an exemplary experimental system used to measure the circuit of FIG. 1;

FIG. 5 is a table that illustrates exemplary pad assignments for the test structure of FIGS. 3 and 4;

FIG. 6 is a schematic top view of a portion of the layout of the differential delay measurement test structure depicted in FIG. 4, illustrating the inner perimeter in greater detail;

DETAILED DESCRIPTION

Figure 3:
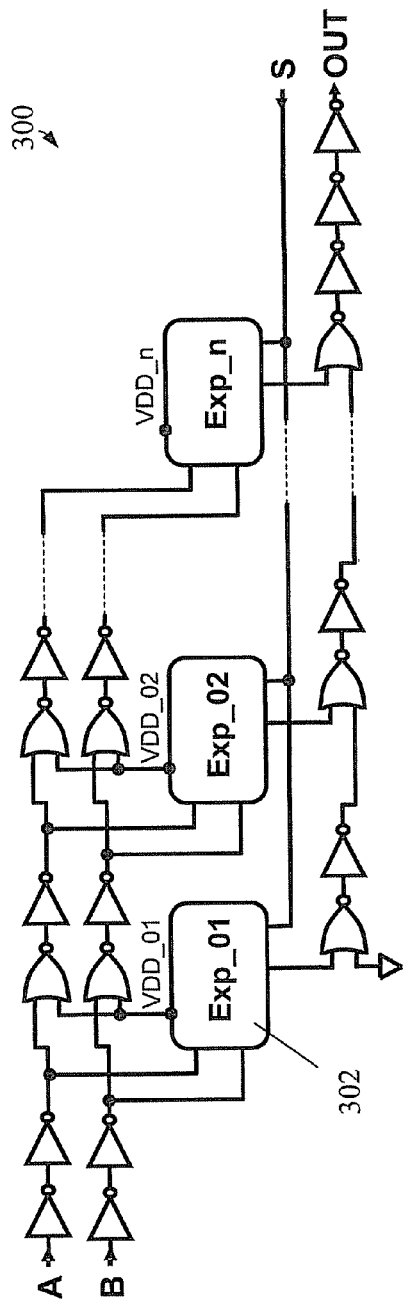
FIG. 3 is a schematic circuit diagram of a simplified top level test structure having a number of differential delay measurement circuits, implemented and testable at the M1 level of manufacture, in accordance with an embodiment of the invention.

Referring initially to FIG. 1, there is shown a schematic diagram of an existing circuit 100 for determining the differential delay characteristics of PDSOI CMOS circuits. The circuit 100 enables measurement of the differential delay characteristics of microelectronic circuits 102 (i.e., devices under test, or DUTs) on a picosecond time scale. In the example depicted, the differential delay characteristics are with respect to a high-speed input signal, A, passed through identical inverters 104a, 104b, with the difference being that inverter 104b is capacitively loaded. A low-speed input signal S is used to select an output signal from the upper path (no capacitive loading) or the lower path (capacitive loading).

As used herein, the term "high-speed" with respect to a signal generally refers to a signal having rise and fall times on the order of about 150 picoseconds or less, and more specifically on the order of about 10s of picoseconds to less than 10 picoseconds for signals internal to an integrated circuit. In contrast, the term "low-speed" with respect to a signal generally refers to a signal having rise and fall times on the order of about 100 nanoseconds or more.

FIG. 2 is a schematic diagram of an exemplary experimental system 200 used to measure the circuit 100 of FIG. 1. If a sharp falling edge is applied to the input (A) of the circuit, the output (OUT) will be a sharp rising edge. As the select signal S is toggled between "0" and "1" the output will move back and forth in time. The amount of movement, $\delta D$, is approximately $R_{sw} \times C$, where $R_{sw}$ is the switching resistance of the DUT and C is the value of the known load capacitance. The variation in $R_{sw}$ with a different input waveform history is thus a measure of the floating body effect of the inverter. With proper engineering of the test structure 100 and the probe card 202 (FIG. 2), the value of $\delta D$ can be determined with sub-picosecond precision using standard off-the-shelf high-speed measurement equipment (e.g., sampling scope 204, pulse generator 206, etc.) as shown in FIG. 2.

Because falling and rising waveforms may be studied separately, this technique allows for the study of effects for both the pullup (PFET dominated) and pulldown (NFET dominated) mechanisms independently. Alternatively, the unloaded and loaded DUTs in FIG. 1 may be replaced with, for example, chains of 5 and 15 inverters respectively. The value of $\delta D$ then represents the delay of 15−5=10 inverters, now averaged over pullup and pulldown. This allows one to measure, for example, the average history of inverters in a chain, which can be compared with more conventional delay chain measurements. This basic technique with multiple synchronized inputs is extendable to a wide variety of experiments in both bulk and PDSOI technologies including, for example, measurement of thermal time constants, latch metastability, and crosstalk between adjacent wiring structures.

In practice, a number of circuits such as that shown in FIG. 1 are incorporated in a single test structure, with some type of selection scheme used to pick a specific experiment to be tested. As used herein, an "experiment" generally refers to a set of logic gates that address a question about a device such as an inverter. Conventionally, all experiment outputs are multiplexed (muxed) into a common output driver requiring only a single high-speed 50Ω input/output (I/O) line. Heretofore, test structures incorporating circuits such as that shown in FIG. 1 have been implemented with (typically) four levels of metal with respect to semiconductor back end of line (BEOL) manufacturing, allowing a very robust power distribution system and good isolation between multiple high-speed inputs and the common output. On the other hand, it is of high value to configure microelectronic test structures such that they are operational and can be measured immediately after the first level of metallization (M1) is in place. In the transistor development phase of a technology most fabrication runs stop at M1, and thus test structures that are testable only at higher levels of metallization (e.g., M2 and higher) provide little opportunity for learning during development.

Even in volume manufacturing M1 testability is highly desirable as it affords an opportunity for wafer deposition early in the process.

Most basic DC transistor diagnostic structures can be structured to be measurable at M1, including for example small addressable arrays. M1 testable ROs are also routinely in use. In addition, an inline testable structure for measuring the average of pullup and pulldown history for long chains of gates has also been implemented at a single level of metal. Each of these types of M1 testable structures requires only low frequency I/Os so that the engineering of the I/O circuitry to interface with commercially available probes and measurement instrumentation is relatively straightforward. However, while such conventional M1 test structures provide some useful information, none provide the detailed switching information that can be obtained with a circuit and measurement technique as described in conjunction with FIGS. 1 and 2. This detailed information, especially as it relates to NFETs and PFETs independently, would be extremely valuable to have at the time the process is being developed and optimized. It is thus of value and importance to design a test structure that requires only a single level of metal and that can be also used to acquire detailed timing information as described above in conjunction with FIGS. 1 and 2.

Accordingly, disclosed herein is a test structure for measuring differential delay characteristics of an extendable geometrically linear set of microelectronic circuits on a sub-picosecond time scale that is fully functional and testable with a single level of metal. This test structure may be used, for example, to measure average gate delays and to provide detailed timing measurements on pullup and pulldown characteristics of individual devices and high frequency matching characteristics of nominally identical devices during the technology development cycle as well as in manufacturing. The design features a novel I/O powering scheme and an I/O circuitry configuration that enables delivery of multiple isolated inputs to the selected one of a set of individually powered experiments, and the subsequent high-speed readout of the experiment, all with sub-picosecond precision.

Referring now to FIG. 3, there is shown a schematic circuit diagram of a simplified top level test structure 300 having a number of differential delay measurement circuits, which structure is implemented and testable at the M1 level of manufacture, in accordance with an embodiment of the invention. As is shown, the test structure 300 includes a plurality of individual experiments 302, individually labeled Exp_01, Exp_02, . . . Exp_n. Each of the experiments 01 through n is independently powered by sources VDD_01 through VDD_n, and all of the remaining I/O circuits are powered through still another independent power supply, I/O VDD (depicted hereinafter). All of the individual power supplies share a common ground.

In the illustrated embodiment, only a single experiment is powered on at a given time, as determined by applying the experiment VDD voltage to the power pad of the only one experiment to be measured. High-speed inputs A and B propagate along respective logic buses from left to right in FIG. 3, but only as far as the selected powered experiment. For example, if the third experiment were selected, then the inputs A and B would pass through the logic stages associated with the first two experiments and be directed to the third experiment. The remaining downstream logic does not propagate the inputs any further, as the NOR logic at each stage of the buses prevents the further propagation of any signal past the point corresponding to the selected experiment (i.e., the associated VDD is high). The NOR/inverter logic associated with any unselected experiments upstream from the selected experiment will simply pass the high-speed signals through. This arrangement minimizes the amount of gate switching associated with high-speed inputs A and B, and reduces undesirable power bus disturbances arising from that switching.

The outputs of all of the experiments are muxed together by a distributed OR function whose output (OUT) emerges from the right side of the test structure 300. Those experiments that are not selected will have no output activity (i.e., the top input to the associated NOR gate will be a static 0), and thus through the subsequent inverter will simply pass a 0 to the lower input of the NOR gate of the next stage. The experiment that is selected will have a toggling output that is input to the upper input of the associated NOR gate, which signal is then propagated to the output terminal OUT. Each of the n experiments may contain, for example, two circuits similar to that shown in FIG. 1, or other circuitry under test. Low-speed input S is used to determine which of the differential paths through the active experiment is selected It should be noted that the circuit diagram in FIG. 3 is incomplete in that it omits a number of inverter pairs (i.e., buffers) in the active paths that are inserted to maintain signal integrity. Between A or B and OUT there are actually about 60 inverting logic stages in a representative implementation (not counting those in the selected experiment), each with a maximum load corresponding to a fanout of about five. All stages are of standard logic gate size, except for the final inverters that comprise an off chip driver providing a signal of about one third of the I/O VDD into a 50Ω output line. This reduced output voltage lowers the power bus disturbance associated with the driver, minimizing any undesirable power bus disturbance.

With only a single level of metal available, crossovers for wiring at the M1 level are accomplished with silicided gate polysilicon shapes (PC) or silicided diffusion areas bounded by isolation dielectric (RX), both of which may have a sheet resistance on the order of about 10 Ω/square, which is about 50 to 100 times that of the metal layer M1. Accordingly, the use of PC or RX in high-speed signal wires should be minimized. To avoid compromise in device performance, the resistance of an output net, metal plus any poly or diffusion segments and associated contacts is to be kept well below the switching resistance of the gate (typically on the order a few hundred Ω), and the addition of large parasitic capacitance is also to be avoided. As robust power distribution is a central feature of high-speed test structures, it becomes particularly challenging when only a single level of metal is available. Here, the complete power distribution system for both the I/O and experiments is implemented entirely on M1 with no poly or RX segments. In addition, since most measurements are in the form of pulse experiments, sufficient decoupling capacitance (DCAP) is incorporated in order to avoid a significant power supply droop and disturbs.

Figure 4:
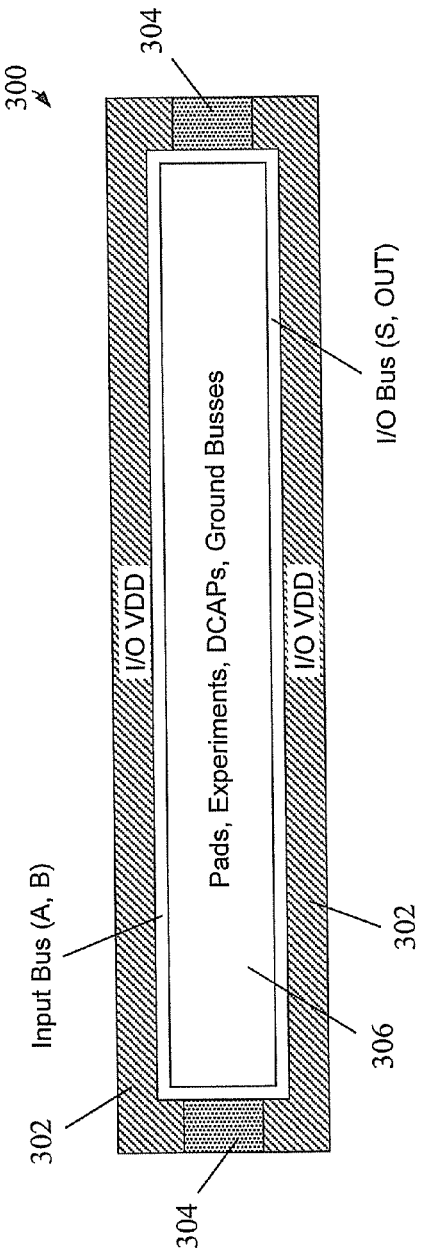
FIG. 4 is a schematic top view of the general layout of the differential delay measurement test structure depicted in FIG. 3.

Referring now to FIG. 4, there is shown a schematic top view of the general layout of the differential delay measurement test structure 300 depicted in FIG. 3. As is shown, residing at the outer perimeter of the generally rectangular structure are the power connections for the I/O circuitry, including I/O VDD bus 302 and I/O VDD pads 304. The I/O power supply connections surround an inner perimeter 306 of the structure that in turn includes the experiments, common ground buses and pads, DCAPS, and experiment VDD pads. Disposed between the inner and outer perimeters are the locations of the input buses 308 (carrying input signals A, B) one side of the structure and the I/O buses 310 (carrying select signal S and output signal OUT). Crossovers of silicided gate polysilicon (PC) or silicided diffusion areas bounded by isolation dielectric (RX) are used to carry the input, output and select signals across the ground buses at M1 to and from the experiment wiring also located at M1.

In an exemplary embodiment, the I/O VDD bus 302 takes the form of a rectangular frame that, as indicated above, encloses the experiments, ground buses, decoupling capacitors, I/O circuitry and remaining pads. In one exemplary implementation, the test structure 300 features a 1×25 set of I/O pads that are about 40 microns (μm)×60 μm in size, on an 80 μm pitch. The entire test structure is about 150 μm wide by 2000 μm long, in one exemplary embodiment.

FIG. 5 is a table that illustrates exemplary pad assignments for the test structure 300 of FIGS. 3 and 4. As shown in FIG. 5, there are a total of ten ground pads (pads 2, 4, 6, 8, 11, 14, 17, 19, 21, 23) and the two I/O VDD pads 304 (FIG. 4) at the right and left ends of the I/O VDD frame (pads 1, 24). In the exemplary embodiment, there are a total of n=8 experiments in the test structure design and, as a result, there are a total of eight individual experiment VDD pads, labeled as V1 through V8. The assignments for V1 through V8 corresponds to pads 7, 9, 10, 12, 13, 15, 16, 18, respectively. I/O pads A (3), B (5), and OUT (22) are serviced by wide bandwidth, 50Ω I/O lines, while the power supply lines and pad S (20) are low frequency connections with decoupling capacitance to ground with additional decoupling capacitance also incorporated in the probe card. Finally, pad assignment 25 is used for a substrate contact (SUB) that can be used to apply a DC bias to the SOI substrate to investigate sensitivities to substrate bias.

Referring now to FIG. 6, there is shown a schematic top view of a portion of the layout of the differential delay measurement test structure 300 depicted in FIG. 4, illustrating the inner perimeter in greater detail. In particular, FIG. 6 shows a portion of the test structure in the vicinity of I/O pads 7, 8 and 9 of the exemplary embodiment, corresponding to the VDD pad for experiment 1 (V1/pad 7), a ground pad (pad 8), and the VDD pad for experiment 2 (V2/pad 9).

As may now more clearly be seen from FIG. 6, the inner perimeter 306 of the structure 300 includes (in addition to the above mentioned I/O pads), ground buses 602, DCAPs 604 and experiments (e.g., Exp_01, Exp_02, etc.). Experiments are positioned in the 40 μm spaces between the corresponding experiment VDD pad and a GND pad, wherein two experiments share a single ground pad. The placement of experiments in the 40 μm gaps between the I/O pads is straightforward to implement with device dimensions characteristic of the 45 nm technology node and beyond. DCAPs 604 for each experiment are positioned both above and below the experiment, as well as outboard of the respective power pad. The common ground buses 602 extend above and below the pads as shown. Again, the I/O circuitry is located in the space between the I/O VDD bus 302 and ground along the top (inputs A and B) and bottom (OUT and S) of the design. I/O decoupling capacitors are placed in these slots as well as in other available space between pads to minimize undesirable power bus disturbances and droop.

The detailed view of FIG. 6 also illustrates the issue of crossover in a single level of metal, with respect to transmitting a signal between the I/O circuitry and the experiments, across the ground bus 602. The heavy arrows at the top portion of FIG. 6 depict the flow of input signals from input buses A and B to the experiments, while the heavy arrows at the bottom portion of FIG. 6 depict the flow of output signals from the experiments to the output OUT. The light arrows at the bottom portion of FIG. 6 depict the flow of the select signal S from the I/O bus to the experiments. As can be seen, the arrows cross over the ground bus 602, which is accomplished with PC or RX crossovers as previously mentioned.

Figure 7:
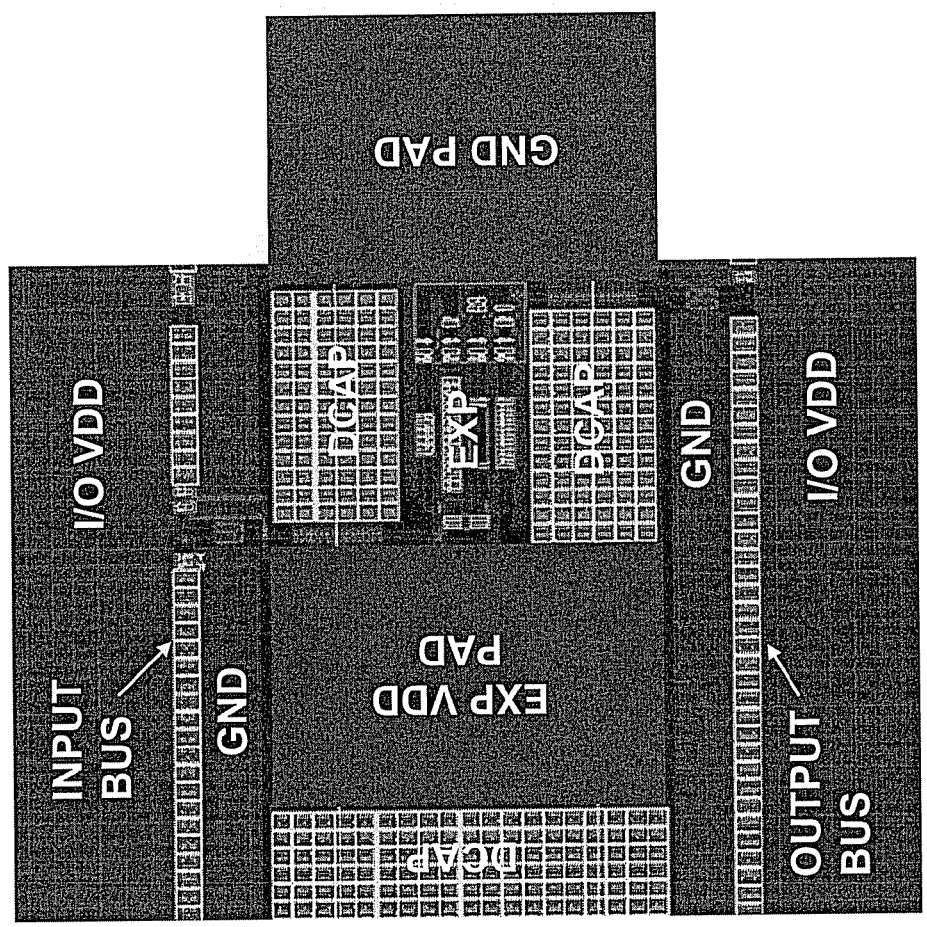
FIG. 7 is a photograph of the test structure layout corresponding to a portion of the schematic diagram of FIG. 6.

FIG. 7 is a photograph of the layout in 45 nm PDSOI technology corresponding to a portion of the schematic diagram of FIG. 6 (showing a single experiment). In the areas where high-speed lines (A, B, and OUT) cross the ground bus, that portion of the ground bus is narrowed down somewhat in a tradeoff between resistance in the ground bus (all in the M1 level) and the resistance in the signal line which contains PC or RX at the crossover location. This tradeoff is done in such a way that the average resistance to ground along the upper or lower horizontal ground bus is maintained lower than the resistance to I/O VDD pads along the relatively wider corresponding I/O VDD structures, an arrangement that is facilitated by the large number of common ground pads.

Figure 8:
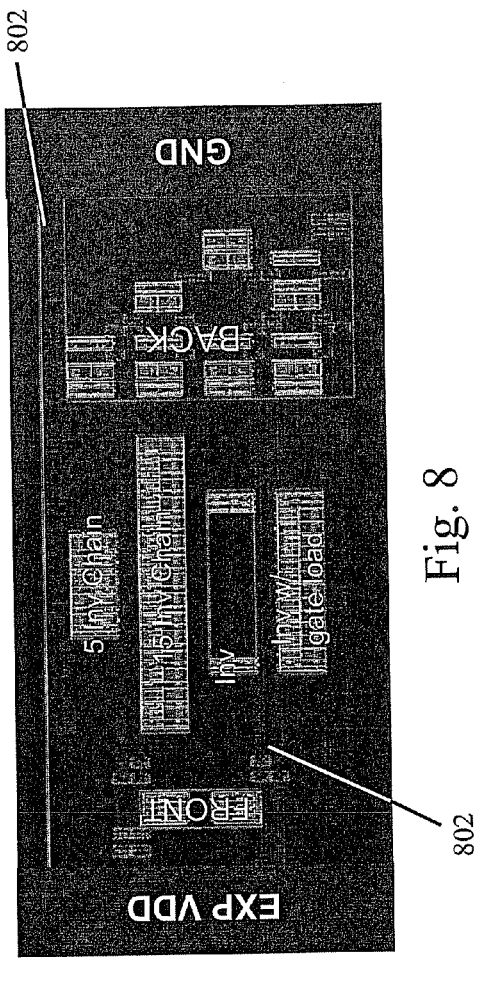
FIG. 8 is a photograph illustrating an experiment of the test structure in further detail.
Figure 9:
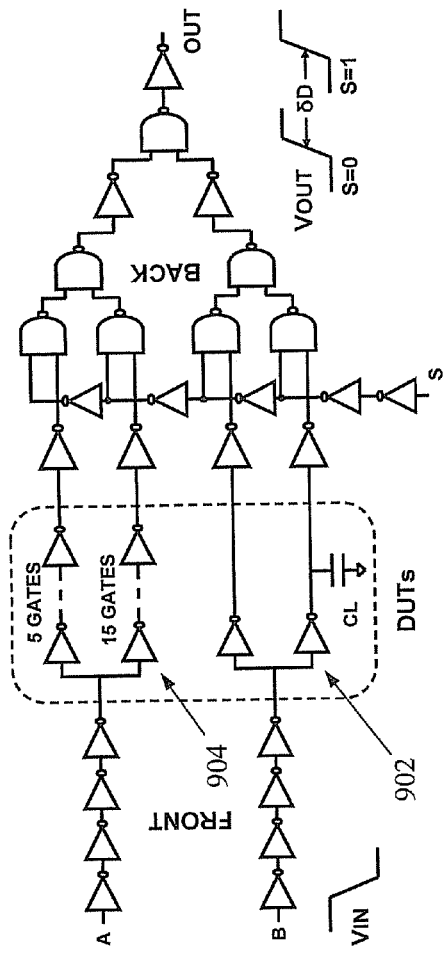
FIG. 9 is a schematic circuit diagram of the experiment shown in FIG. 8.

The power distribution within an experiment itself is shown in the photograph in FIG. 8, which depicts a set of interdigitated fingers 802 emanating from the ground and experiment VDD pads. Logic gates of the experiment are in turn disposed between the ground and experiment VDD fingers. A circuit diagram corresponding to the experiment layout of FIG. 8 is shown in FIG. 9. In this example, there is a loaded versus unloaded differential inverter sub-experiment 902 similar to that shown in FIG. 1, as well as a 15-inverter versus 5-inverter chain sub-experiment 904 similar to that previously described.

The FRONT portion of the experiment serves to condition the incoming waveforms A and B to ensure sharp edges are applied to the DUTs while the BACK portion implements the select (S) function to switch between the paths of the sub-experiments and also muxes together the outputs of the two sub-experiments. It will be noted that the input to the sub-experiment being measured is toggled as desired while the input to the other sub-experiment is held at "0". The BACK portion of the experiment then functions to deliver the output of the sub-experiment being measured to the OUT terminal of the experiment. Signal crossovers of the power distribution fingers 802 comprise sections of PC below the M1 level, with additional sections of PC being added where needed to balance the inputs to the DUTs.

The other experiments of the exemplary test structure incorporate various other circuit types for the DUTs including, for example, NANDs, NORs, passgate circuits, and gates with different device types such as those provided with higher or lower threshold voltages. In the case of multiple input DUTs, one or two inputs can be connected to the high-speed input(s) with other inputs hard-wired to VDD or ground. Each of these experiments are implemented with a single level of metal; however, it will be appreciated that experiments with any number of metal levels may also be inserted, including gates that are product logic books, SRAM cell components, latches, etc. The close proximity of the experiment VDD and ground pads, along with the associated decoupling capacitors ensures robust power distribution to the experiments while the I/O portion of the test structure implemented with only a single level of metal continues to provide for high integrity input and output signals. It follows that the disclosed test structure provides a very versatile single framework for circuits that can be measured with only one level of metallization, as well as for those requiring multiple levels of metal as well.

The test structure embodiments described herein have been fabricated and verified in 45 nm PDSOI technology and have been demonstrated to measure history effects in various circuits. With respect to the overall integrity of the design, two observations have been made. First, the differential delay measurement results do not depend on the value of the I/O VDD. This demonstrates the robustness of the power supply design strategy and verifies that there is no significant coupling between the I/O VDD power distribution and circuitry and that of individual experiments. Second, there are approximately 60 logic stages between the input and output of the test structure (not counting those in the selected experiment). The measured distribution of the time jitter in a delay measurement made at the output of the test structure with a sampling oscilloscope typically has a one sigma value about 1.5 ps. Given that the intrinsic jitter in the sampling scope system itself is about 1 ps, this suggests that the additional jitter due to the combined temporal variation within the 60 stages is on the order of about 1 ps or less, comparable to that observed in corresponding designs utilizing four levels of metal.

For many (most) differential delay measurements of interest only a single high-speed input signal is required. In some cases where two high-speed inputs are necessary, the relative timing is not critical, so the signals can be separated by, for example, 100 ps or more, with minimal interaction between the two input signals. However, in cases where two inputs are required close to each other in time, and where precise relative timing between the high-speed input signals is important, there may be a concern with the above described layout in that the A and B inputs run parallel to each other along the top input bus, thus creating the potential for significant capacitive coupling. This situation becomes increasingly more acute as experiments further to the right (opposite end of the inputs) are selected.

Figure 10:
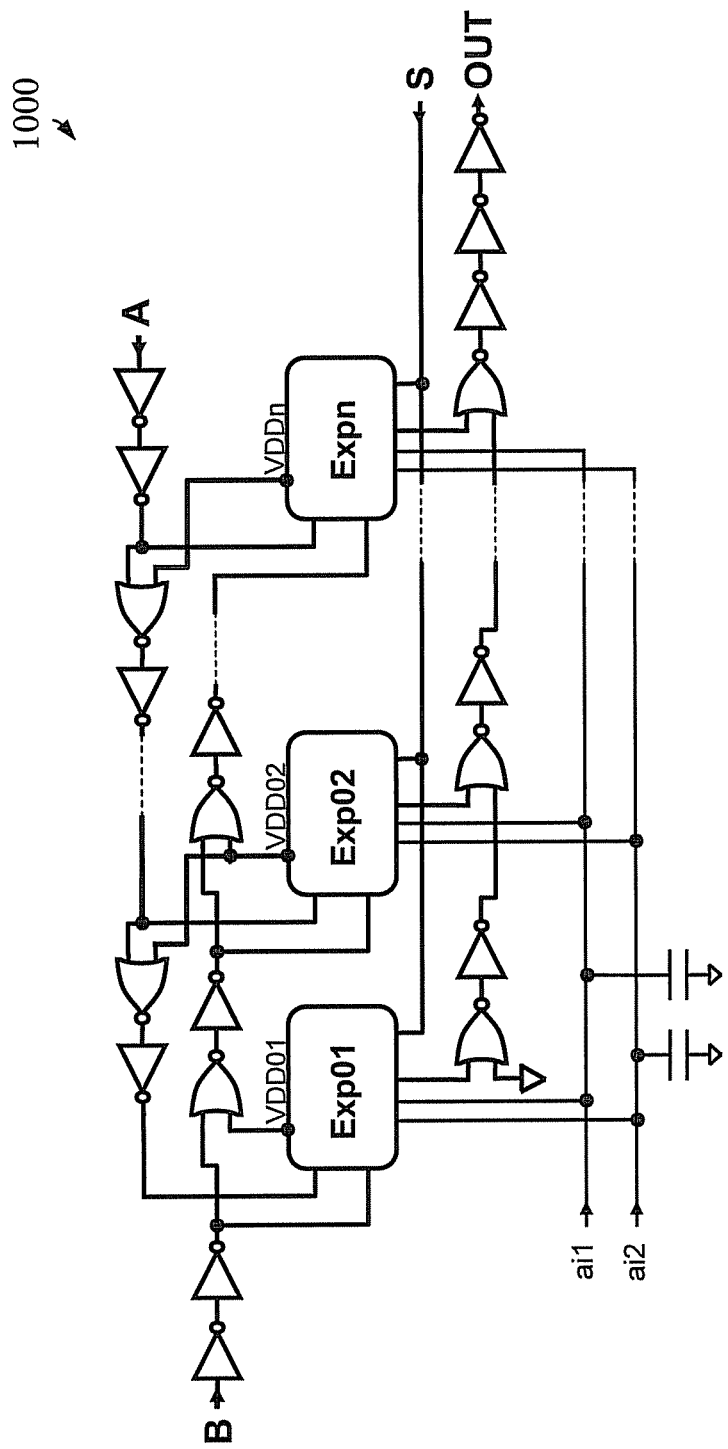
FIG. 10 is a schematic circuit diagram of a simplified top level test structure having a number of differential delay measurement circuits, which structure is implemented and testable at the M1 level of manufacture, in accordance with another embodiment of the invention.

Accordingly, FIG. 10 is a schematic circuit diagram of a simplified top level test structure 1000 having a number of differential delay measurement circuits, which structure is implemented and testable at the M1 level of manufacture, in accordance with another embodiment of the invention. In this embodiment, the M1 testable differential delay measurement test structure 1000 provides improved isolation between the high-speed input lines A, B. More specifically, the two high-speed inputs come in from opposite ends of the test structure, with only a very short parallel run between the input bus and the experiment. For even rarer cases where three nearly simultaneous high-speed inputs are desired, it is also possible to add a third high-speed input (not shown) in the bottom I/O bus running from left to right. Since the logic is configured to stop the high-speed input signal at the experiment under test, the overlap between the active portion of a third path and the active portion of the output path will be small with minimal opportunity for undesired coupling.

As further shown in FIG. 10, the test structure 1000 also includes capacitively decoupled low-speed inputs, ai1 and ai2, which can serve at least two different purposes. First, they can provide low-speed (essentially DC) analog inputs to various circuits in the experiment, such as to current starved inverters for adjusting the slew of the inputs applied to the DUTs, or to passgate circuits for detailed study of floating body effects in PDSOI passgates or study of negative bias temperature instability (NBTI) effects in either SOI or bulk silicon devices. Alternatively, these low-speed lines can be used as inputs to a decoder (not shown) for use in selecting the sub-experiment to be tested, thereby allowing more sub-experiments per experiment.

For such DC lines that drive only the gates of transistors the current flow is extremely low so considerable resistance in the lines can be tolerated with no penalty. For example, to add such a line one experiment can be removed with the associated DCAPs now inserted between the low-speed input and ground. This line can cross the ground and I/O VDD buses (top or bottom) on poly and then run outside of and parallel to the I/O VDD bus on M1, with a tap running down to each experiment on poly. This can be easily implemented with a resistance to any experiment of no more than a few thousand Ω, which will have no impact on the intended circuit function.

With a fixed number of I/O pads in the test structure, any addition of further high-speed or DC inputs is balanced by a decreased number of experiments, although on the other hand this will enable more sub-experiments to be located in some or all of the experiments. It will also increase the complexity of the design with only a single metallization layer. Conversely, if the number of pads in the test structure is increased, the modular design is directly extendable to a larger number of experiments.

Finally, still additional functionality is achievable using the above described M1 level test structure embodiments; namely, high-speed matching characterization. Mismatch between nominally identical MOSFETs is an important consideration in, for example, SRAM cells and various analog circuits. Typically, such mismatch is characterized by careful measurements of a small number of matched pairs under DC conditions. However, there are also important AC effects such as anomalously high and variable gate resistance (lateral or vertical) that such DC characterizations will miss altogether. Accordingly, FIGS. 11 and 12 are schematic circuit diagrams of high-speed differential delay experiments that could be used to characterize such mismatches, in accordance with a further embodiment of the invention.

Figure 11:
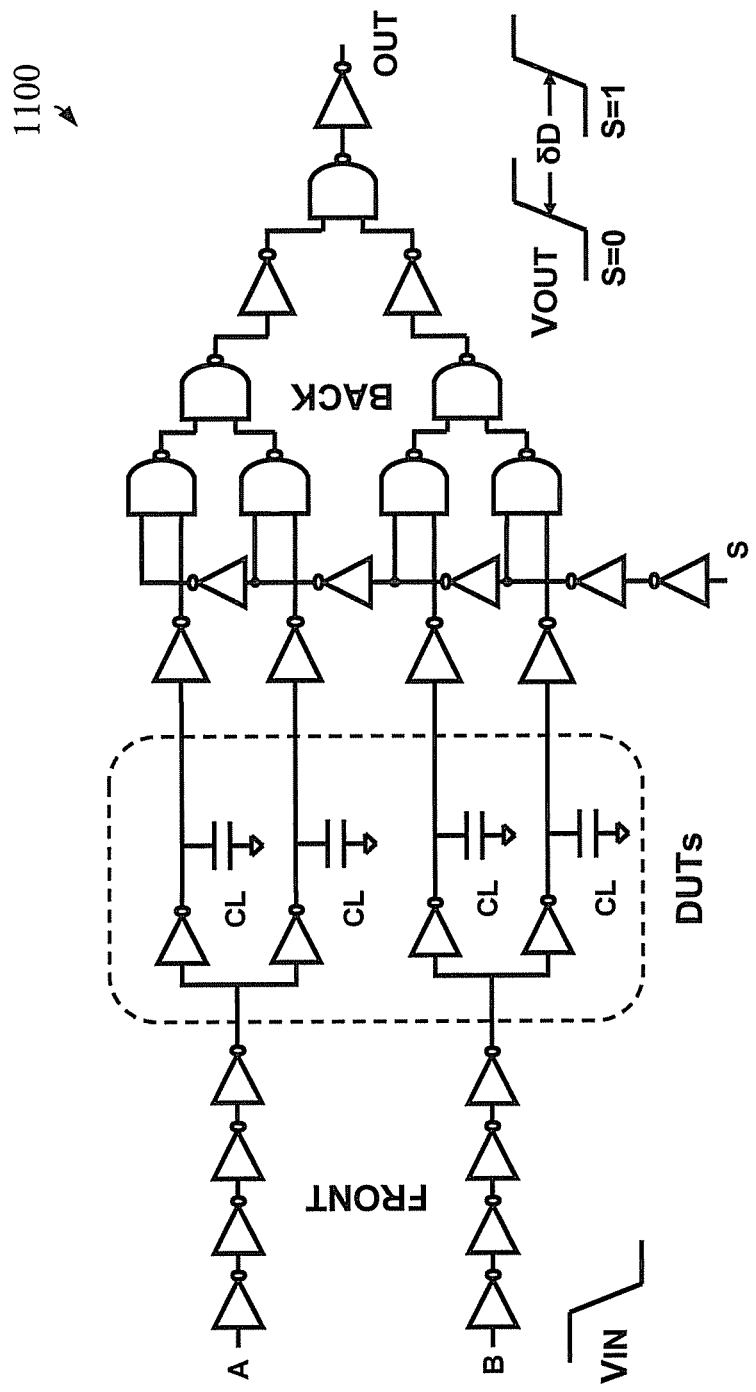
FIGS. 11 and 12 are schematic circuit diagram of additional experiments that may be used in conjunction with M1 level test structures, in accordance with a further embodiment of the invention.
Figure 12:
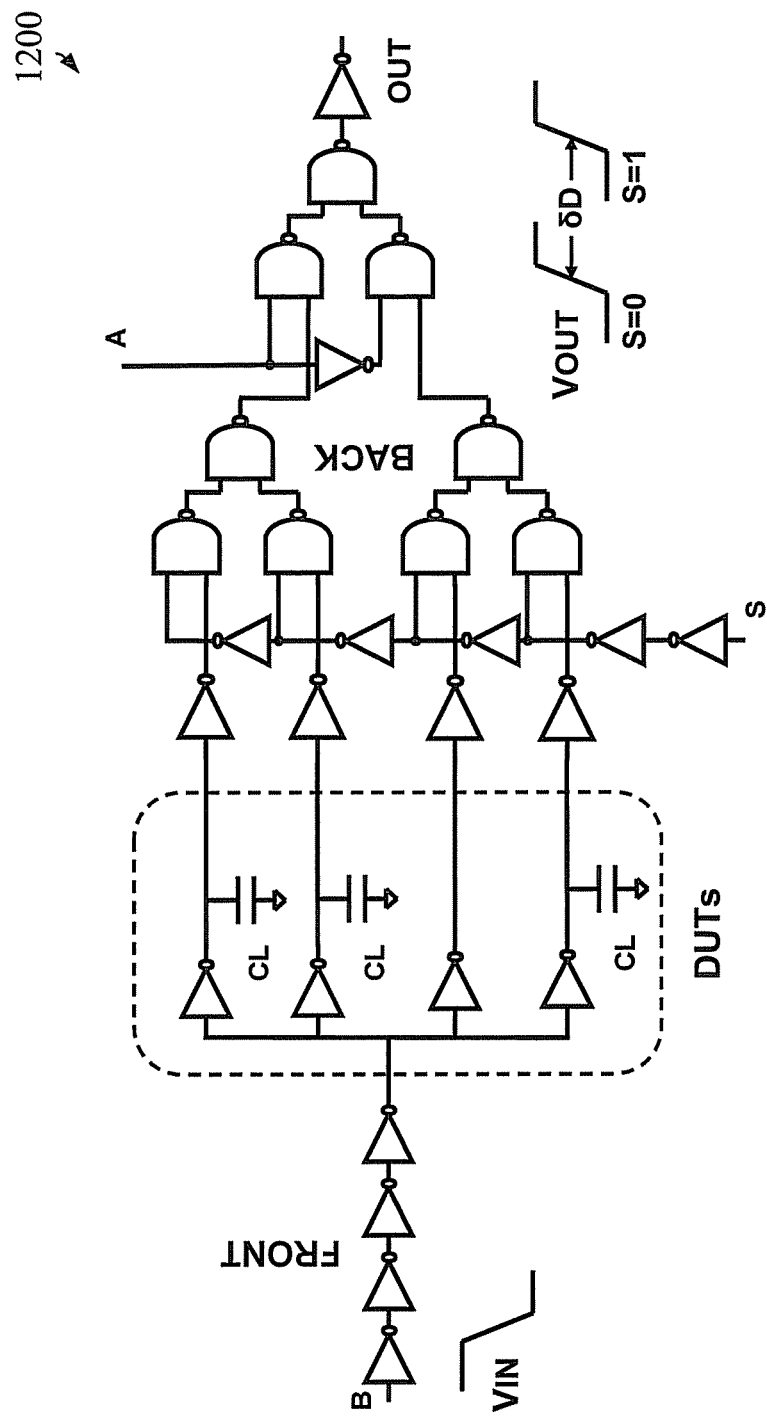

In the case of the experiment 1100 shown in FIG. 11, two independent mismatch measurements can be made, wherein a fractional mismatch in switching resistance is determined by normalizing the delay difference to the simulated delay. With the experiment 1200 shown in FIG. 12, input A serves as a low-speed input similar to S and the delay of three heavily loaded gates can be measured with respect to a reference unloaded gate. Here, the fractional mismatch in switching resistances among the three loaded gates is directly determined with no simulation required. It will be noted that in both of these cases, CL is made sufficiently large and the non-DUT gate widths sufficiently large that that the variability is dominated by the differences in the loaded DUTs' switching resistances. The addition of more high and low-speed inputs, as previously described, would enable many more such mismatch circuits to be placed within a single integrated test structure.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of testing an integrated circuit device, the method comprising:
   selectively inputting one or more high-speed input signals to one or more experiments and outputting at least one high-speed output signal therefrom, each experiment each comprising two or more logic gates configured to determine differential delay characteristics of individual circuit devices, at a precision level on the order of picoseconds to less than 1 picosecond; and
   wherein the one or more experiments are disposed, and are fully testable, at a first level of metal wiring (M1) in the integrated circuit device.

2. The method of claim 1, further comprising determining a signal delay between a capacitively loaded logic gate and an unloaded, identical logic gate.

3. The method of claim 1, further comprising determining a signal delay difference between a chain of a first number of logic gates and a chain of a second number of logic gates.

4. A method of testing an integrated circuit device, the method comprising:
   selectively inputting one or more high-speed input signals to one or more experiments and outputting at least one high-speed output signal therefrom, each experiment each comprising two or more logic gates configured to determine differential delay characteristics of individual circuit devices, at a precision level on the order of picoseconds to less than 1 picosecond;
   wherein the one or more experiments are disposed, and are fully testable, at a first level of metal wiring (M1) in the integrated circuit device; and
   propagating a pair of the one or more high-speed input signals in a linear direction, through logic included in an input bus also formed on the M1 level of wiring, to a selected one of the experiments, wherein the experiments are arranged along the linear direction such that the logic passes the high-speed signals past any non-selected experiments upstream from the selected experiment and block the high-speed signals from reaching any non-selected experiments downstream from the selected experiment.

5. The method of claim 4, wherein each experiment includes an independent power source associated therewith.

6. The method of claim 5, wherein only the independent power source associated with the selected experiment is active.

7. The method of claim 4, further comprising communicating, through an input/output bus also formed on the M1 level of wiring, a select signal to each of the experiments for determining which of the differential paths through the active experiment is selected, and multiplexing, through the input/output bus, outputs of each of the experiments such that non-selected experiments produce no output activity and an output signal of the selected experiments is passed to an output terminal.

8. The method of claim 7, further comprising implementing crossovers of wiring in the M1 level with one or more of: sections of silicided gate polysilicon and silicided diffusion areas bounded by isolation dielectric below the M1 level.

9. The method of claim 7, further comprising communication, with the input/output bus, of one or more additional low-speed input signals to each of the experiments.

10. The method of claim 9, wherein the additional low-speed input signals perform one or more of: adjusting a slew of the high-speed input signals, facilitating study of floating body effects, facilitating study of negative bias temperature instability (NBTI) effects, and decoding specific sub-experiments that are selectable within a given experiment.

11. The method of claim 10, wherein at least one of the experiments comprises circuitry configured to determine a mismatch in switching resistance between nominally identical transistor devices.

* * * * *